United States Patent [19]
Smith et al.

[11] Patent Number: 5,424,914
[45] Date of Patent: Jun. 13, 1995

[54] THROUGH BACKPLANE IMPINGEMENT COOLING APPARATUS

[75] Inventors: Grant M. Smith, Bryn Athyn; John A. Helgenberg, Collegeville, both of Pa.

[73] Assignee: Unisys Corporation, Blue Bell, Pa.

[21] Appl. No.: 157,858

[22] Filed: Nov. 24, 1993

[51] Int. Cl.⁶ ............................................. H05K 7/20
[52] U.S. Cl. ................................. 361/694; 165/908; 361/796
[58] Field of Search ................... 211/41; 165/80.3, 122, 165/126, 908, 104.34; 454/184; 174/16.1; 361/796, 784, 785, 788, 690, 692, 693–695, 719–721

[56] References Cited

U.S. PATENT DOCUMENTS

| | | | |
|---|---|---|---|
| 4,674,004 | 6/1987 | Smith | 361/384 |
| 4,947,288 | 8/1990 | Olsson | 361/796 |
| 5,063,476 | 11/1991 | Hamadah | 361/384 |
| 5,067,047 | 11/1991 | Azar | 361/384 |
| 5,196,989 | 3/1993 | Zsolnay | 361/796 |
| 5,210,680 | 5/1993 | Scheibler | 165/80.3 |

FOREIGN PATENT DOCUMENTS 1-111296  6/1989  Japan ...................... 361/695

*Primary Examiner*—Gerald P. Tolin
*Attorney, Agent, or Firm*—Robert R. Axenfeld; Mark T. Starr; Kin-Wah Tong

[57] ABSTRACT

The present invention relates to an apparatus for providing a cooling system for electrical components mounted to the opposite side of a backplane from that on which the cooling air is dispersed. The invention of the present application accomplishes this cooling by providing for siphoning a portion of the cool air from the air plenum, directing it up a duct, and delivering it through a series of apertures onto the component which requires cooling on the back side of the backplane. The apertures include one through the backplane which is homologously positioned with respect to the electrical component on the back side of the backplane.

16 Claims, 5 Drawing Sheets

THROUGH BACKPLANE IMPINGEMENT COOLING APPARATUS

BACKGROUND OF THE INVENTION

It is recognized in the art that a variety of factors must be considered when designing cooling systems for electronic equipment such as a large scale computer system. These concerns include the performance of the system, cost, reliability and the amount of maintenance required for the system.

As has been stated in U.S. Pat. No. 4,674,004 entitled "Parallel-Flow Air System for Cooling Electronic Equipment", a system characterized by simplicity yet still providing adequate cooling for the electronic equipment represents the best solution to a thermal cooling problem. Air cooling is generally regarded in the art as the most simple and reliable such system. However, as recognized in the above mentioned patent, the power density on computer cards continually increases and it becomes increasingly more difficult to cool with air.

Better cooling schemes typically involve blowing air across the computer card in a direction parallel to the surface of the card. As the air travels across the card it picks up heat in a serial fashion from the components mounted thereon and the air increases in temperature. With the rise in card power levels, large bodies of air are needed to keep the air temperature rise from exceeding acceptable levels.

The cooling problem is further exacerbated by the increase in power and size of the integrated circuit packages for components mounted thereon. The high power levels of these devices result in higher than average local temperature rises. Each pocket of high temperature air is directed by the air flow onto the next package in a system such as that mentioned above. Also, as such devices become physically larger the device tends to block the flow of air to the downstream packages in the system.

Because of each of these mentioned thermal effects, packages at the end of the air stream in such an environment face a flow of high temperature, low velocity air. In addition, the thermal effects of such systems become more difficult to control in proportion to the increase in physical size and power dissipation of the circuit boards and circuit packages mounted thereon.

U.S. Pat. No. 4,674,004 teaches a system in which a parallel air flow system provides a series of card-duct assemblies within the foreplane area of a computer system in which the circuit boards mentioned above are located to provide a directed air flow to each of the components dispersed on the circuit boards therein.

Recent advances in system design have created a new problem for cooling such electronic equipment. The environment for which the present invention is well-suited to provide cooling is one in which electrical components are mounted on the opposite side of a backplane from that on which the cooling air is dispersed.

Mounting components on this backplane side of a backplane creates a series of environmental constraints making it particularly difficult to deliver cool air to the location. In particular, there is a limited space in which to implement a cooling system without expanding the cabinet of the system itself, which is not desirable. In such a constrained environment there is such limited space that the use of an additional air handler and/or adequately sized heat sinks is not practical. Such solutions would cause an increase in the size of the system cabinet. They also increase the cost of the system to add the additional air handler and/or heat sinks.

SUMMARY OF THE INVENTION

The present invention takes advantage of the air cooling system provided on the foreplane side of a backplane system to deliver sufficient of the cool air from the air plenum to the backplane area to cool the components located therein. The invention of the present application accomplishes this cooling by providing a means for siphoning a portion of the cool air from the air plenum, directing it up a duct, and delivering it through a series of apertures onto the component which requires cooling on the backplane side of the backplane. The apertures include one through the backplane which is homologously positioned with respect to the electrical component on the backplane side of the backplane.

Thus, in the preferred embodiment of the present invention, air from the main air plenum enters an air duct through an intake. The duct is attached to the foreplane side of the backplane. Air is directed up the duct, through an aperture and onto a component on the backplane side of the backplane.

Note that the use of such a system requires that the design of the backplane be such that an aperture in the backplane at the appropriate locations will not interfere with the circuit connections within the backplane.

In the preferred embodiment, a series of components may be mounted on the backplane side of the backplane. The number and location of the components may vary depending on the configuration of the system. The preferred embodiment of the present invention includes a series of apertures through the aforementioned duct and backplane at locations on the backplane where components may be mounted on the backplane side of the backplane.

Thus, a cooling system is available for each component as it is added to the system without requiring alteration to the cooling system as originally constructed. In this way, the present system ensures that each electrical component added on the backplane side of the backplane will receive cooling air at the air plenum inlet temperature while the temperature difference between components mounted on the backplane is minimized.

The system of the present invention also requires the much lower volume of airflow per power dissipated in contrast to the serial airflow method mentioned above if it were employed on the backplane side of the backplane. Also, the system of the present invention also provides a lower average component temperature than that for the above mentioned serial air system for the given air pressure and volume of air through the backplane area.

These and other advantages are accomplished without requiring the additional air handler or heat sink which would take additional room in the backplane area, and perhaps increase the size of the system itself, and which increase the cost and complexity of the system as well.

DETAILED DESCRIPTION OF THE PREFERRED EMBODIMENT

Figure 1:
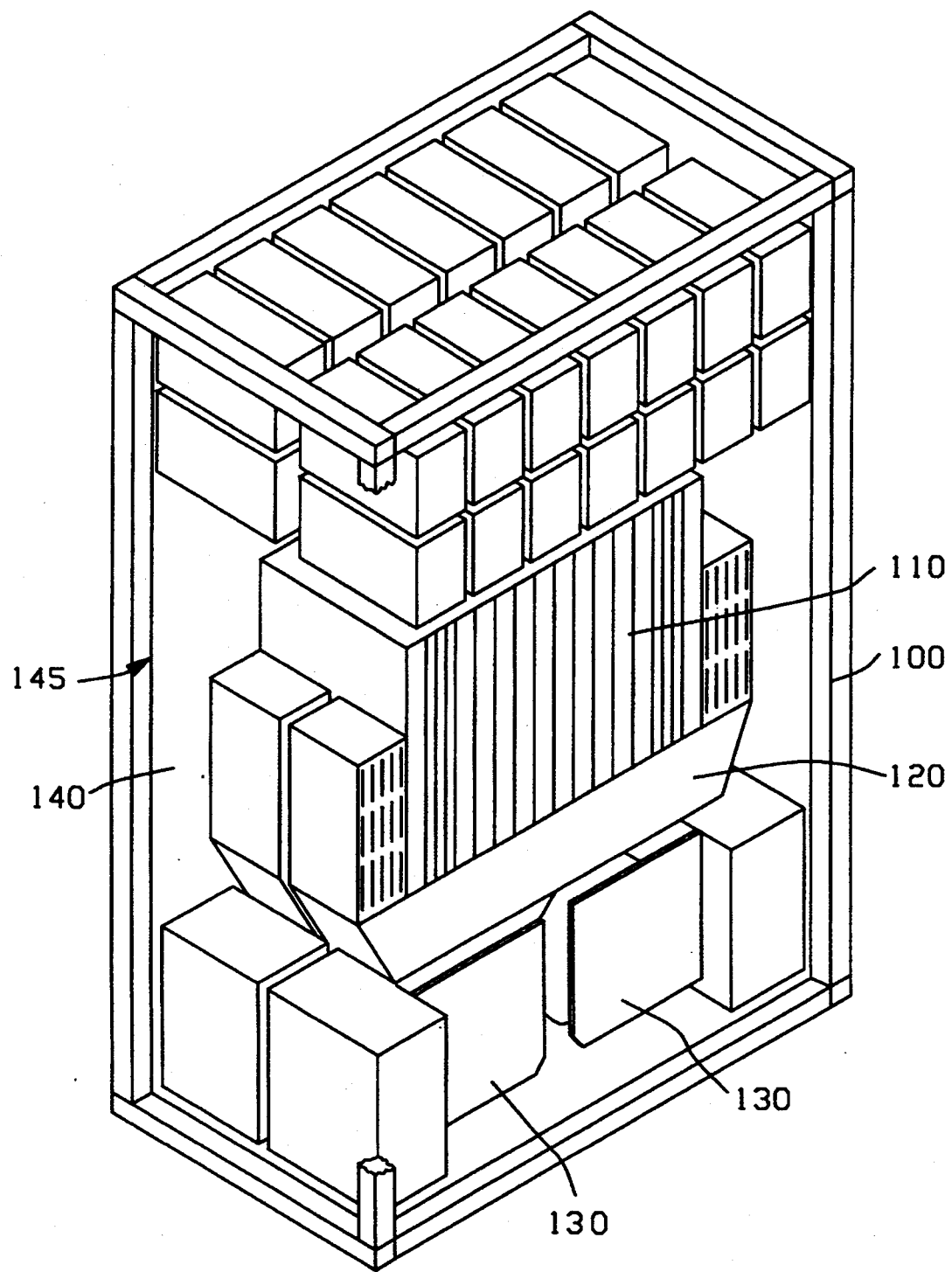
FIG. 1 is a depiction of the computer system in which the present invention is implemented in the preferred embodiment.

FIG. 1 depicts a computer system in which the preferred embodiment of the present invention is incorporated. A cabinet 100 is shown with the outer walls partially cut away to show the interior foreplane area of the backplane of the computer system.

The system includes one or more printed circuit cards 110 which are mounted above an air plenum 120 which is coupled to a pair of blowers 130 located at the bottom of the cabinet 100. The blowers draw air into the cabinet and force it into the plenum area to cool the circuit cards and devices mounted on the foreplane side 140 of the backplane 145. Thus, a large volume of fast moving cool air is delivered by the blowers 130 to the main air plenum 120.

Figure 2:
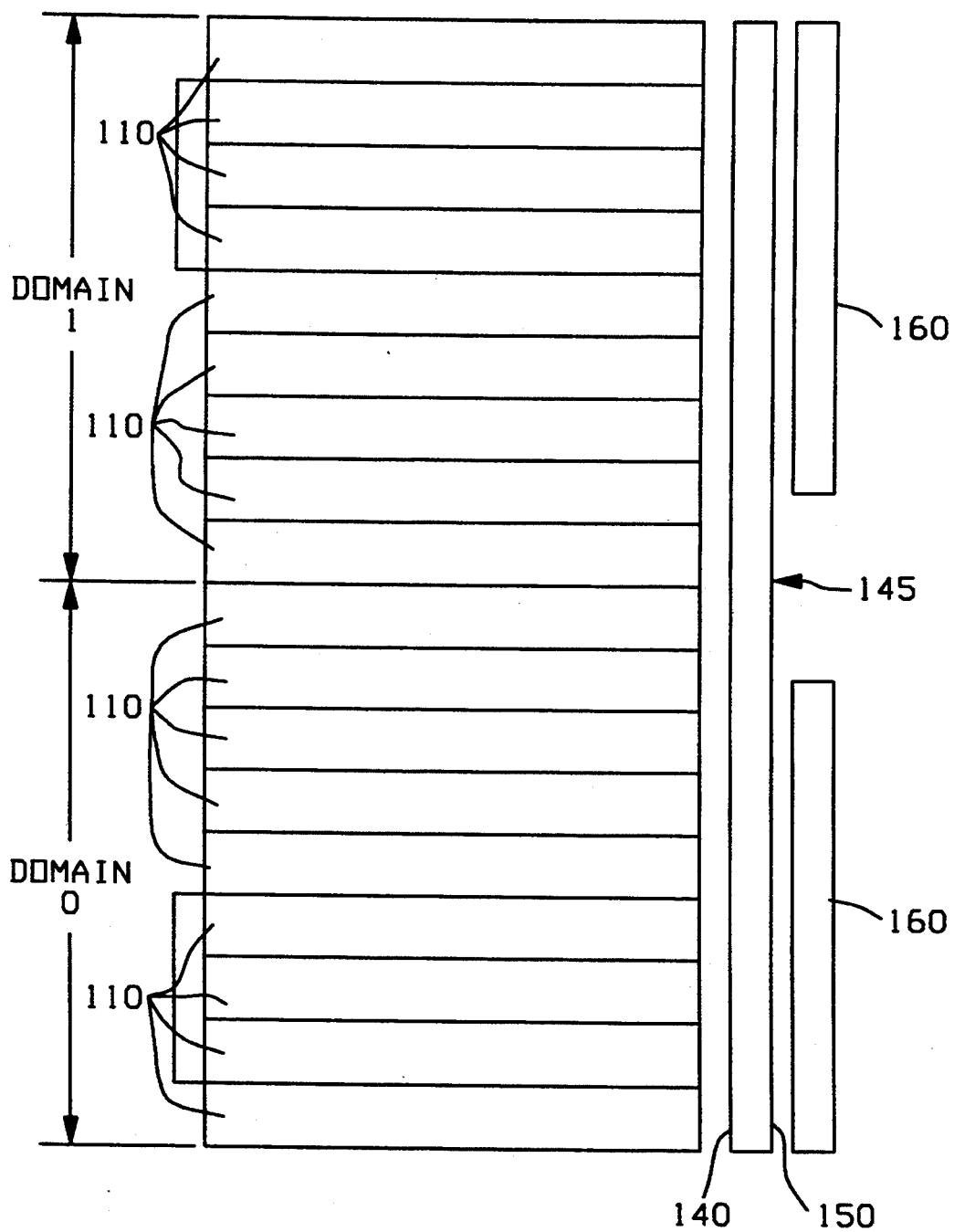
FIG. 2 is an overview cross-section of the backplane and the boards connected thereto in the preferred embodiment of the present invention.

Referring now to FIG. 2 wherein there is illustrated an overview cross section of the backplane 145 and the associated circuit boards 110 coupled thereto in the preferred embodiment of the present invention. Backplane 145 has a foreplane side 140 on which are connected a plurality of circuit boards 110. These circuit boards 110 receive cool air from the plenum 120 up through the foreplane area to cool the boards 110 and the components mounted thereon.

The problem faced in the preferred embodiment was that backplane boards 160 were to be mounted on the backplane side 150 of the backplane 145 and no cooling was provided to this backplane side 150 of the backplane 145 in previous systems. The addition of heat sinks to the components or the addition of an air flow handler for the area is not desirable because of the additional space and cost for such a design. The present invention permits cool air to be delivered precisely where required on the backplane side 150 of the backplane 145 without the addition of an air handler or heat sinks.

Figure 3:
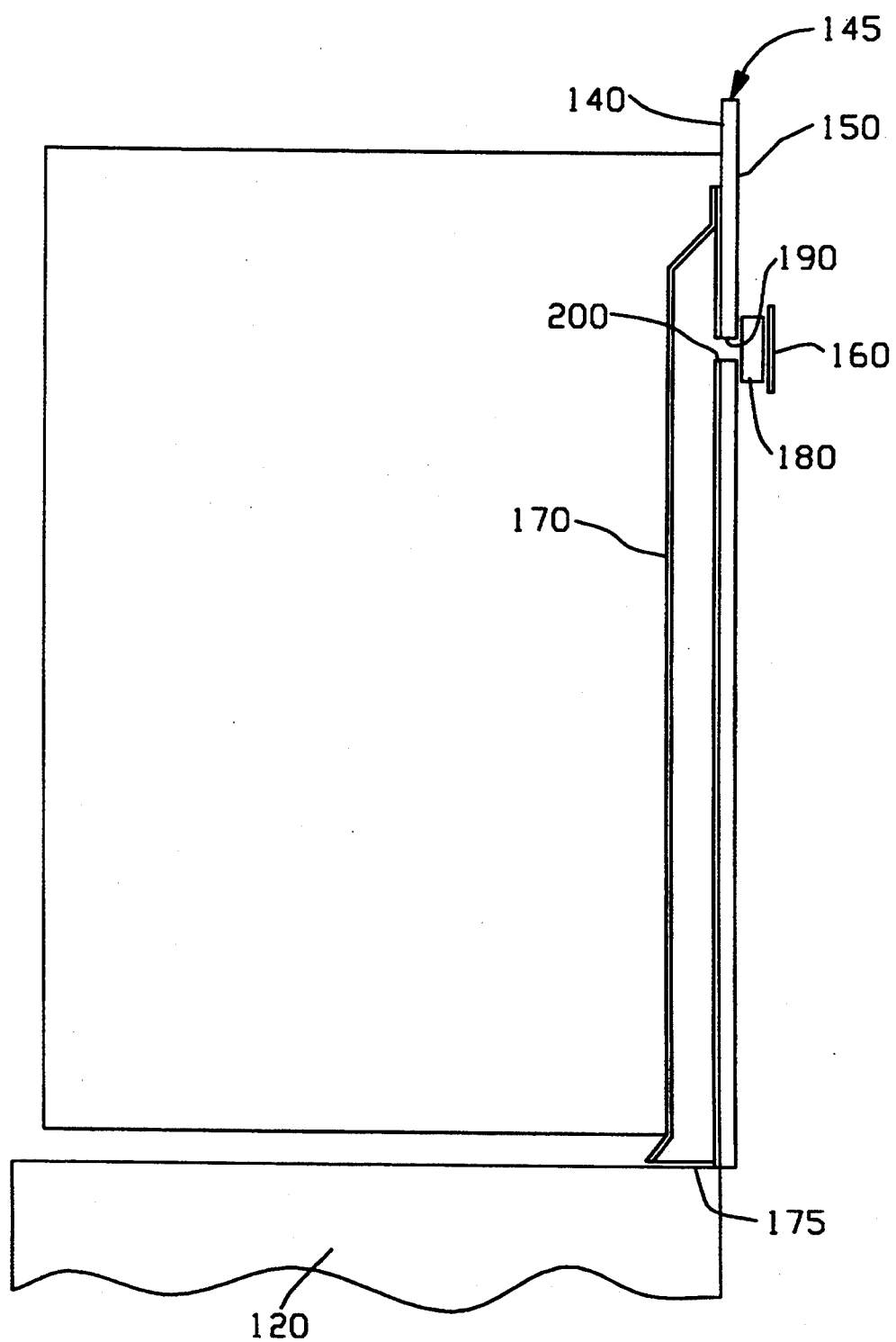
FIG. 3 is a cross-sectional view from the side of the backplane and air duct means in the preferred embodiment of the present invention.

With reference to FIG. 3 it may be seen that air duct 170 is disposed on the foreplane side 140 of backplane 145. The duct 170 has an intake opening 175 which is coupled to air plenum 120. In the preferred embodiment the intake opening 175 is flared to permit a wider opening through which cool air from the plenum 120 may pass into the air duct 170.

Daughter board 160 is disposed on the backplane side 150 of the backplane 145. On the daughter board 160 is shown a component 180 which requires cooling. In the preferred embodiment, an aperture 190 exists in the backplane 145 from the foreplane side 140 to the backplane side 150. The backplane aperture 190 is homologously positioned with respect to the component 180.

Air duct 170 includes an aperture 200 on the side of the air duct closest to the foreplane side 140 of the backplane 145. The air duct aperture 200 is homologously positioned with respect to the backplane aperture 190.

In the preferred embodiment, the air duct 170 is comprised of four sides. Three sides are comprises of molded anti-static plastic, which reduces electro-static discharge problems. The fourth side is the surface of the foreplane side 140 of the backplane 145. The three-sided ESD plastic ductwork is coupled to the surface of the foreplane side 140 to form a complete duct 170.

Thus, it can be seen that in the preferred embodiment of the present invention the air flow from the plenum 120 enters the duct 170 through input opening 175 travels up the duct and exists through the air duct aperture 200. The air then passes through the backplane 145 through backplane aperture 190 to deliver cool air on the surface of component 180.

Figure 4:
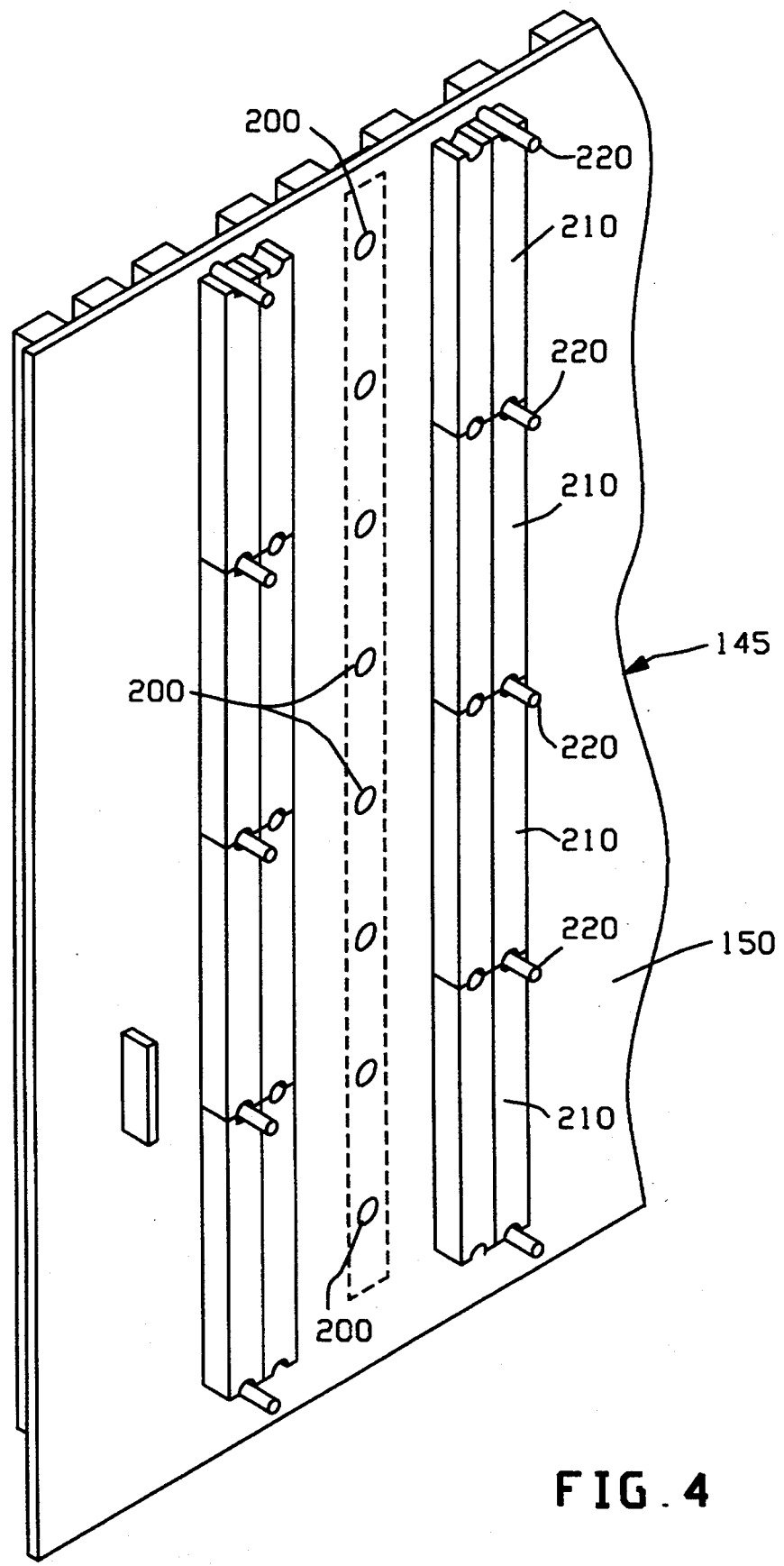
FIG. 4 is an illustration of the backplane side of the backplane in the preferred embodiment of the present invention.

FIG. 4 shows an expanded view of the backplane side 150 of backplane 145 for the preferred embodiment. A series of backplane apertures 200 are disposed in a column along the backplane 145. Backplane connectors 210 are located such that when a daughter board 160 is connected to the backplane 145 via the connector 210 the component 180 on the board 160 will be homologously aligned with the backplane aperture 200. In the preferred embodiment, a series of guide pins 220 are also provided to ensure proper alignment of the backplane card 160 when coupled to connector 210.

Figure 5:
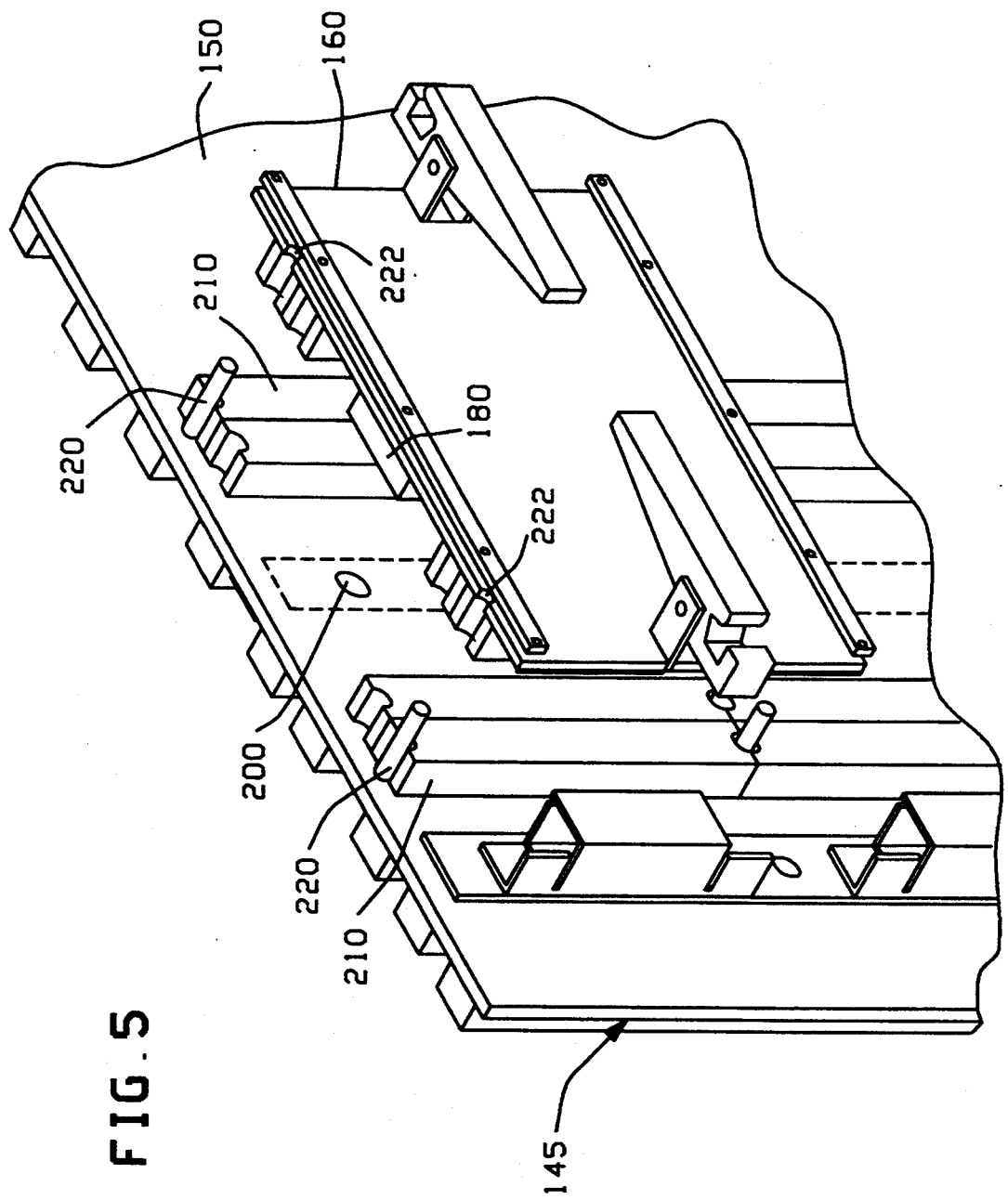
FIG. 5 is an illustration of a circuit board, including a component mounted thereon, which may be mounted on the illustrated backplane side of the backplane in the preferred embodiment of the present invention.

FIG. 5 depicts a backplane board 160 aligned with a board location on the backplane side 150 of backplane 145. A portion of component 180 is shown homologously aligned with aperture 200 when backplane board 160 is in position for connection to the backplane 145 via coupler 210. Such position is ensured by guide pins 220 and guide holes 222.

A feature of the present invention is that the actual volume of cooling air provided by the apertures 190 and 200 may be adjusted, or chosen, in accordance with the thermal dissipation required for the electrical component 180 mounted on the backplane side 150 of the backplane 145. Given the pressure in the air plenum 120 and in the air duct 170, the size of the apertures 190, 200 may be adjusted to permit the proper airflow over the component 160 without affecting the cooling characteristics in the foreplane area where the other circuit cards 110 are mounted.

Some of the many advantages of the present invention should now be readily apparent. For example, a novel system of providing cooling to an electrical component which is not in the area of an electrical system which is receiving the cool air from an existing cool air system has been provided. By modifying the size of apertures 190 and 200 or the size of air duct 170, more or less cooling may be provided to the previously uncooled area than is provided on the cooled area in the system.

Obviously many modifications and variations of the present invention are possible in light of the above teachings. It is therefore to be understood that the foregoing embodiments are presented by way of example only and that was in the spirit of the claims attached hereto that the invention may be practiced other than specifically described.

What is claimed:

1. An apparatus for providing air-cooling to an electrical component comprising:

a backplane, including a first side and a second side, wherein said backplane includes a first aperture between said first side and said second side, and wherein said first side has mounted thereon a plurality of circuit cards;

an air duct, disposed along said first side of said backplane, including an intake opening at one end of said air duct, wherein said air duct includes a second aperture located on the side of the air duct closest to said first side and wherein said second aperture is homologously positioned with respect to said first aperture in said backplane;

mounting means, coupled to said second side of said backplane, for mounting said component on the second side of said backplane in such a manner that said component is homologously positioned with respect to said first aperture on said backplane;

an air source for causing air flow into said intake opening of said air duct and through said first and second apertures, thereby directing a stream of cooling air upon said component.

2. The apparatus of claim 1 wherein said first side of said backplane comprises one side of said air duct.

3. The apparatus of claim 1 wherein said air source includes a main air plenum, coupled to said intake opening of said air duct, for receiving cooling air from a cool air source.

4. The apparatus of claim 1 wherein:
said intake opening is flared to increase the volume of air intake from said air source.

5. The apparatus of claim 1 wherein said mounting means comprises a circuit board.

6. The apparatus of claim 5 wherein said circuit board is coupled to said second side of said backplane.

7. The apparatus of claim 1, wherein said first side is the foreplane side of said backplane and said second side is the backplane side of said backplane.

8. An apparatus for providing air-cooling to a plurality of electrical components of a computer system comprising:

a backplane, including a first side and a second side, wherein said backplane includes a plurality of first apertures between said first side and said second side;

an air duct, disposed along said first side of said backplane, including an intake opening at one end of said air duct, wherein said air duct includes a plurality of second apertures located on the side of said air duct closest to said first side and wherein said plurality of said second apertures are homologously positioned with respect to said plurality of said first apertures in said backplane;

mounting means, coupled to said second side of said backplane, for mounting said components on said second side of said backplane in such a manner that each said component is homologously positioned with respect to one of said plurality of first apertures on said backplane; and an air source for causing air flow into said intake opening of said air duct and through said plurality of first apertures and said plurality of second apertures, thereby directing a stream of cooling air upon each of said plurality of components.

9. The apparatus of claim 7 wherein said first side of said backplane comprises one side of said air duct.

10. The apparatus of claim 8 wherein said mounting means comprises a circuit board.

11. The apparatus of claim 8 wherein said mounting means comprises a plurality of circuit boards.

12. The apparatus of claim 10 wherein said circuit board is coupled to the second side of said backplane.

13. The apparatus of claim 11 wherein said plurality of circuit boards are coupled to said second side of said backplane.

14. The apparatus of claim 12 further including:
a first electrical connector means disposed on said second side of said backplane;
a second electrical connector means disposed on said circuit board wherein said second electrical connector means is coupled with said first electrical connector means.

15. The apparatus of claim 14 further including: guide means between said circuit board and said backplane and connected to said second side of said backplane to ensure the proper positioning of said circuit board.

16. The apparatus of claim 8, wherein said first side is the foreplane side of said backplane and said second side is the backplane side of said backplane.

* * * * *